(12) United States Patent
Ma et al.

(10) Patent No.: US 12,075,180 B2
(45) Date of Patent: Aug. 27, 2024

(54) ENHANCED CONVERSION-GAIN IMAGE SENSOR

(71) Applicant: Gigajot Technology, Inc., Pasadena, CA (US)

(72) Inventors: Jiaju Ma, Monrovia, CA (US); Donald Hondongwa, Pasadena, CA (US)

(73) Assignee: Gigajot Technology, Inc., Pasadena, CA (US)

( * ) Notice: Subject to any disclaimer, the term of this patent is extended or adjusted under 35 U.S.C. 154(b) by 0 days.

(21) Appl. No.: 17/827,513

(22) Filed: May 27, 2022

(65) Prior Publication Data

US 2022/0385853 A1    Dec. 1, 2022

Related U.S. Application Data

(60) Provisional application No. 63/195,136, filed on May 31, 2021.

(51) Int. Cl.

| | |
|---|---|
| *H04N 25/778* | (2023.01) |
| *H01L 27/146* | (2006.01) |
| *H04N 25/53* | (2023.01) |
| *H04N 25/709* | (2023.01) |
| *H04N 25/75* | (2023.01) |
| *H04N 25/79* | (2023.01) |

(52) U.S. Cl.
CPC ..... *H04N 25/778* (2023.01); *H01L 27/14612* (2013.01); *H04N 25/53* (2023.01); *H04N 25/709* (2023.01); *H04N 25/75* (2023.01); *H04N 25/79* (2023.01)

(58) Field of Classification Search
CPC .... H04N 25/778; H04N 25/53; H04N 25/709; H04N 25/75; H04N 25/79; H01L 27/14612; H01L 27/14603; H01L 27/14616; H01L 27/1463; H01L 27/14689; H01L 27/14614; H01L 27/14643

See application file for complete search history.

(56) References Cited

U.S. PATENT DOCUMENTS

| | | |
|---|---|---|
| 8,471,310 B2 | 6/2013 | Hynecek |
| 8,773,562 B1 | 7/2014 | Fan |
| 9,881,964 B1 * | 1/2018 | Mao .................. H01L 27/14636 |
| 2009/0140365 A1 * | 6/2009 | Lee .................. H01L 27/14683 |
| | | 257/460 |

(Continued)

FOREIGN PATENT DOCUMENTS

| | | | |
|---|---|---|---|
| CN | 104659040 A | * | 5/2015 |
| GB | 2537421 | | 10/2016 |

OTHER PUBLICATIONS

English translation of CN-104659040-A (Year: 2015).*

(Continued)

*Primary Examiner* — Shahbaz Nazrul
(74) *Attorney, Agent, or Firm* — Robert C. Kowert; Kowert, Hood, Munyon, Rankin & Goetzel, P.C.

(57) ABSTRACT

An amplifier transistor within an image-sensor pixel is implemented upside down relative to conventional orientation such that a substrate-resident floating diffusion node of the pixel forms the gate of the amplifier transistor—achieving increased pixel conversion gain by eliminating the conventional metal-layer interconnection between the floating diffusion node and amplifier-transistor gate and concomitant parasitic capacitance.

19 Claims, 3 Drawing Sheets

(56) References Cited

U.S. PATENT DOCUMENTS

2015/0349005 A1* 12/2015 Yamashita ........ H01L 27/14605
    257/292
2020/0275043 A1* 8/2020 Ma ....................... H04N 25/778
2022/0385853 A1* 12/2022 Ma ..................... H01L 27/14614

OTHER PUBLICATIONS

International search report and written opinion from PCT/US2022/031449, dated Sep. 8, 2022, pp. 1-12.
Anish Kumar K. P. et al., "Kink-Free Polycrystalline Silicon Double-Gate Elevated-Channel Thin-Film Transistors," IEEE Transactions on Electron Devices, vol. 45, No. 12, Dec. 1998, pp. 2514-2520.
Furuta et al., "Bottom-Gate Poly-Si Thin Film Transistors Using XeCl Excimer Laser Annealing and Ion Doping Techniques," IEEE Transactions on Electron Devices, vol. 40, No. 11, Nov. 1993, pp. 1964-1969.
Lai et al., "A Novel Vertical Bottom-Gate Polysilicon Thin Film Transistor with Self-Aligned Offset," IEEE Electron Device Letters, vol. 17, No. 5, May 1996, pp. 199-201.

* cited by examiner

ENHANCED CONVERSION-GAIN IMAGE SENSOR

CROSS-REFERENCE TO RELATED APPLICATIONS

This application hereby claims priority to and incorporates by reference U.S. provisional application no. 63/195,136 filed May 31, 2021.

TECHNICAL FIELD

The disclosure herein relates to integrated-circuit image sensors.

DRAWINGS

The various embodiments disclosed herein are illustrated by way of example, and not by way of limitation, in the figures of the accompanying drawings and in which like reference numerals refer to similar elements and in which.

DETAILED DESCRIPTION

Integrated circuit image sensors having gain-enhanced, inverted-amplifier pixels are disclosed in various embodiments herein. In a number of embodiments, the inverted-amplifier pixels are implemented by respective four-transistor (4T) MOS (metal oxide semiconductor) circuits in which a pinned photodiode and floating diffusion node are coordinated (to enable shuttering, photocharge integration and read-out) by a reset transistor, transfer gate, read-select transistor and amplifier transistor, with the latter biased for source-follower operation and thus implementing a "source follower" transistor (SF). In contrast to conventional implementations in which the gate of the source-follower transistor is isolated from the substrate-resident source and drain terminals by an oxide layer and coupled via metal-layer interconnect to a substrate-resident floating diffusion node (FD), the source-follower transistor is inverted (implemented upside down relative to conventional orientation) such that the substrate-resident FD itself forms the source-follower gate (with the SF source and drain implemented above an over-substrate oxide layer—the conventional location of the SF gate), eliminating the metal-layer FD-to-SF-gate interconnect and concomitant parasitic capacitance Eliminating that metal-layer interconnect (between FD and SF gate), a substantial and often predominant parasitic contributor to the net capacitance of the floating diffusion node ($C_{FD}$), yields an exceedingly low-capacitance floating diffusion and correspondingly enhanced/increased conversion gain—enlarging the floating-diffusion voltage step per incoming photocarrier (i.e., as the FD voltage ($V_{FD}$) is given by $q/C_{FD}$, where 'q' represents the photocharge transferred from the photodiode to the FD). In a number of embodiments, the source, drain and channel of the inverted source-follower transistor are implemented in polysilicon region (separated from the FD-bearing silicon substrate by a thin oxide layer), while in other embodiments epitaxial silicon is formed over the oxide layer (opposite the single-crystal silicon substrate) and then doped to form the SF source and drain. In a number of implementations, the floating diffusion node is merged with the source terminal of the reset transistor (i.e., the FD node and source terminal of the reset transistor are formed by a unified doped region of the silicon substrate), avoiding the parasitic capacitance of an ohmic interconnect between those circuit elements and thus further increasing the pixel conversion gain. In other embodiments, the inverted amplifier may be coupled/biased in alternative amplifier configurations (e.g., common source amplifier or any other practicable amplification arrangement) and one or more per-pixel transistors may be implemented off-die (e.g., read-select transistor implemented in counterpart logic die within a die stack). These and other features and embodiments are discussed in greater detail below.

Figure 1:
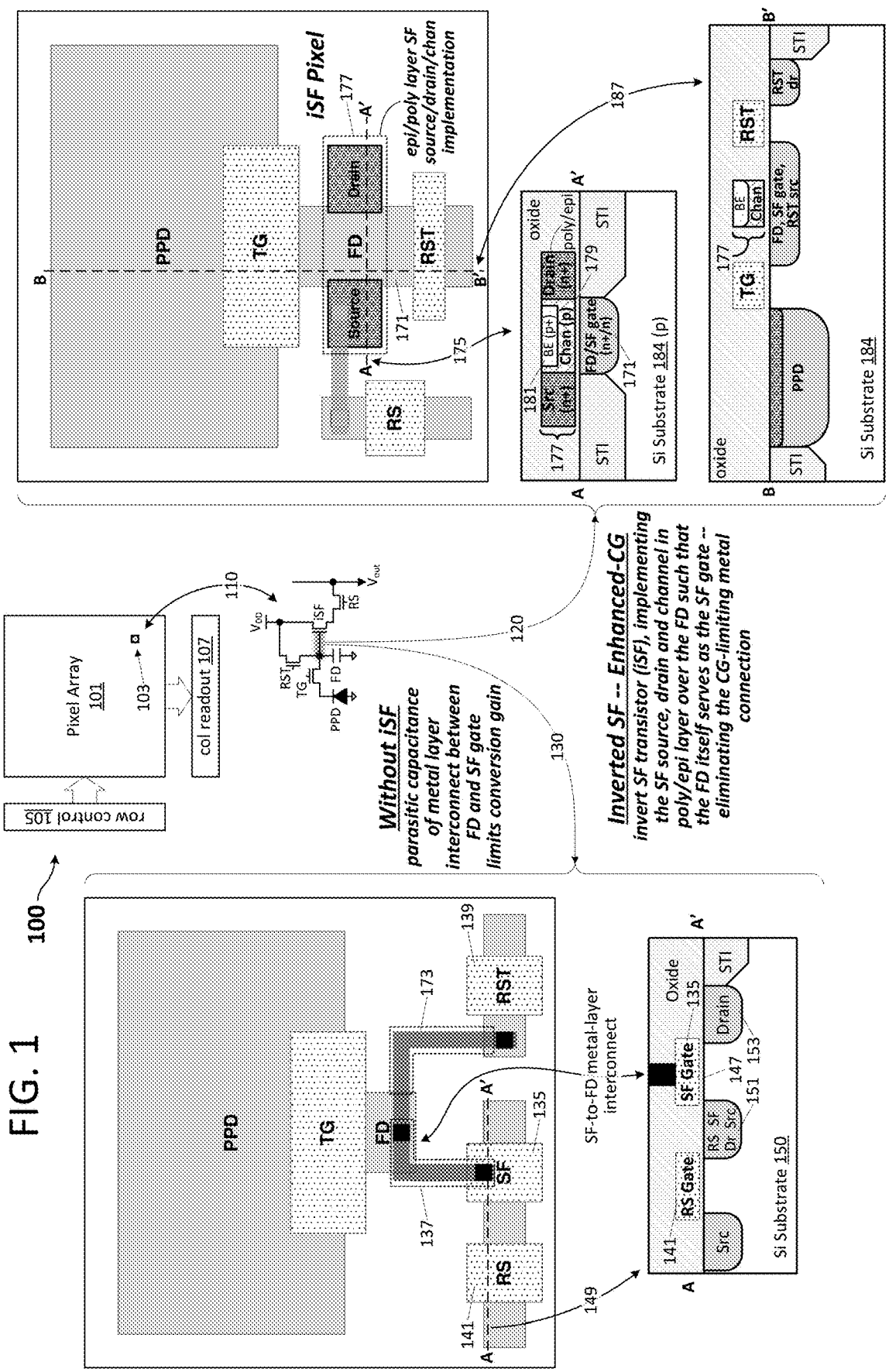
FIG. 1 illustrates an embodiment of an integrated-circuit image sensor having a pixel array populated by inverted-amplifier pixels.

FIG. 1 illustrates an embodiment of an integrated-circuit image sensor 100 having a pixel array 101 populated by inverted-amplifier pixels 103, contrasting an exemplary implementation of those pixels with conventional-amplifier pixels. Image sensor 100 also includes row control circuitry 105 and column readout circuitry 107, the former to issue row-control signals that cycle individual pixels 103 (or rows or clusters of pixels) between shuttering, charge-integration and readout operations, while per-column circuit blocks within the column-readout circuitry 107 sample (and optionally amplify) and digitize per-pixel readout signals (e.g., performing rolling-shutter, correlated-double-sampling readout of reset-state signals and image signals output from individual pixels). Image sensor 100 may include various other unshown components including, for example and without limitation, sequencing/timing control circuitry to coordinate operations within row controller 105 and column-readout circuitry 107, image processing circuitry (e.g., image construction circuitry, color-balancing circuitry, filtering circuitry, etc.), configuration circuitry to enable programmatic configuration of the pixel array (e.g., charge and/or voltage binning to achieve a desired dynamic range and spatial resolution, row-shuttering management to enable global or rolling shutter, row-sequencing management to enable clustered pixel readout with acceptable temporal offset between readout of adjacent-rows in neighboring clusters, etc.) and so forth. Also, while the pixel array 101, row controller 105 and column readout circuitry 107 may be implemented in a single integrated circuit (IC) die, those individual circuit blocks and/or any portion thereof may be implemented in two or more interconnected IC dies (e.g., stacked and/or laterally disposed IC dies), with those dies or any subset thereof packaged discretely or together (forming a multi-die package).

In the exemplary implementation presented in detail view 110, each inverted-amplifier pixel 103 includes a pinned photodiode (PPD) (any other practicable charge-integrating photodetection element may be used), transfer gate (TG), floating diffusion node (FD), reset transistor (RST), inverted source-follower transistor (iSF) and read-select transistor (RS) interconnected as shown. Row controller 105 shutters pixel 103 in preparation for charge integration by switching on the reset transistor and transfer gate concurrently (i.e., charging the floating diffusion node and photodiode to a reset potential at or near $V_{DD}$ in this example) and then switches the transfer gate off to isolate the photodiode and thereby commence an exposure interval (or integration interval) during which incident photons (incident light) trigger photocarrier release and thus photocharge accumulation within the photodiode. At conclusion of the integration interval, row controller 105 switches on read-select transistor to enable the inverted source-follower transistor to drive column output line $V_{out}$ (a signal line biased by a current source to establish a steady-state voltage between the gate and source nodes of the inverted source follower and thus a source voltage on output line $V_{out}$ that rises and falls with (follows) the FD voltage) and thus commence a correlated-double-sampled (CDS) readout. At the start of the CDS readout, row controller 105 pulses the reset transistor (if not left on after shuttering) to restore the floating diffusion node to the reset potential and thereby yield a corresponding reset-state signal on $V_{out}$ (i.e., to be sampled within column readout circuit 107). After reset-state sampling (and while the reset transistor remains off), row controller 105 pulses the transfer gate (forming a conductive channel between the pinned photodiode and floating diffusion node) to transfer accumulated photocharge from the photodiode to the floating diffusion. This charge transfer operation shifts the voltage of the floating diffusion ($V_{FD}$) in accordance with the number of transferred charge carriers (electrons in this exemplary n-type MOS (metal oxide semiconductor) pixel circuit) thereby driving, via the inverted source-follower transistor, an image signal on $V_{out}$ representative of the photocharge accumulated during the integration interval (and thus the luminance intensity during the integration interval). As the image signal is nominally referenced to the reset-state VFD potential, the reset-state sample (obtained prior to photocharge transfer) is subtracted from the sampled image signal in either the analog or digital domain to yield a correlated-double-sampled signal (analog or digital) representative of the transferred photocharge.

Still referring to FIG. 1, the voltage step of the floating diffusion node per unit of transferred photocharge—a figure of merit referred to as conversion gain (CG)—is inversely proportional to the FD capacitance so that conversion gain is maximized (e.g., reducing input-referred noise and improving low-light sensitivity) when FD capacitance is minimized. Recognizing that FD capacitance is established generally by a combination of parasitic capacitances in which inter-metal capacitance (of metal interconnects within the image sensor IC) plays a substantial role, and more specifically that the metal interconnect between the floating diffusion node and gate terminal (shaded in the pixel schematic at 110) of a conventional source-follower transistor tends to be a major (in some instances predominant) parasitic contributor to the FD capacitance, that metal interconnect is eliminated within the pixels of image sensor 100 by physically inverting the source follower transistor so that the floating diffusion node itself forms the SF gate.

Exemplary pixel layout views 120 and 130 contrast implementations with (120) and without (130) an inverted-source follower, the latter having a conventionally-implemented source-follower transistor in which the gate terminal 135 is coupled to the floating diffusion node (FD) by a CG-limiting metal-layer interconnect 137. More specifically, in the conventional implementation 130, the gate of the SF transistor, like the gates of the reset transistor (139) and read-select transistor (141) and the transfer gate (TG), is implemented by a conductive region (e.g., doped polysilicon) disposed over a thin oxide layer 147 visible in profile view 149, the oxide layer being disposed in turn on a silicon substrate 150 (e.g., single-crystal silicon) having SF source and drain depositions 151, 153 (with the region of the silicon substrate between the source and drain constituting a gate-controlled conduction channel). Metal interconnect 137—a significant and often predominant parasitic contributor to the FD capacitance as discussed above—extends from the oxide-suspended gate (i.e., gate suspended above substrate 150 by oxide layer) to a metal routing layer above the oxide (not shown in profile view 149) and then back down into the substrate to contact the floating diffusion node.

In the inverted source-follower layout example at 120, the metal interconnect is eliminated by flipping the SF transistor orientation over—implementing the SF gate in the silicon substrate (e.g., single-crystal silicon possibly lightly p-doped) and the SF source and drain terminals (and channel) of the SF transistor in an over-substrate oxide layer. In this inverted-transistor implementation, the floating diffusion itself is extended under the SF source/drain/channel instantiation to serve double duty as both the gate of the SF transistor and the floating diffusion node. In embodiments where the floating diffusion node and the source terminal of the reset transistor are implemented by equivalent dopant levels (i.e., equivalent concentrations of n-type dopant), a single integrated diffusion region 171 may serve additionally as the source terminal of the reset transistor, obviating the metal interconnect shown at 173 (in layout 130 without iSF) between reset transistor source terminal and floating diffusion and thus further reducing parasitic contribution to FD capacitance (enabling yet higher CG).

In one embodiment, the source, drain and channel of the inverted source-follower transistor (which, as discussed above, may be coupled in other amplification configurations) are implemented within an oxide-suspended silicon layer—for example a polysilicon deposition (or single-crystal silicon grown epitaxially) on the thin oxide film covering the silicon substrate. Referring to profile view 175 (along A-A') of the inverted-SF layout, for example, a lightly p-doped polysilicon or epitaxial silicon region 177 is formed above thin oxide layer 179—referred to herein as the oxide-suspended silicon region—and then heavily n-doped at both ends to form source and drain terminals of the iSF transistor. In the depicted implementation, a more heavily p-doped (p+) region 181, referred to herein as the bulk-emulator (BE), is formed within the upper surface of the oxide-suspended silicon to enable iSF channel biasing. More specifically, the bulk emulator is coupled to the $V_{SS}$ rail (or to the transistor source as discussed below) to bias the iSF channel in a manner similar to the grounding of the bulk silicon substrate 184 (e.g., coupling to $V_{SS}$) to bias the silicon bulk and thus any transistor channels formed therein (e.g., channels of the read-select and reset transistors and the channel formed between PPD and FD via the transfer gate). Profile view 187 illustrates the oxide-suspended silicon region 177 in relation to the transfer gate TG and reset-transistor-gate RST (i.e., along line B-B'), showing the single unified diffusion region (within the bulk silicon substrate 184) that serves as the floating diffusion node, iSF transistor gate and reset transistor source, extending from a point beneath the transfer gate, under the iSF channel (in the oxide-suspended silicon) to a point beneath the gate of the reset transistor. Shallow trench isolation structures (STI) isolate the PPD and reset transistor drain from neighboring pixels.

Figure 2:
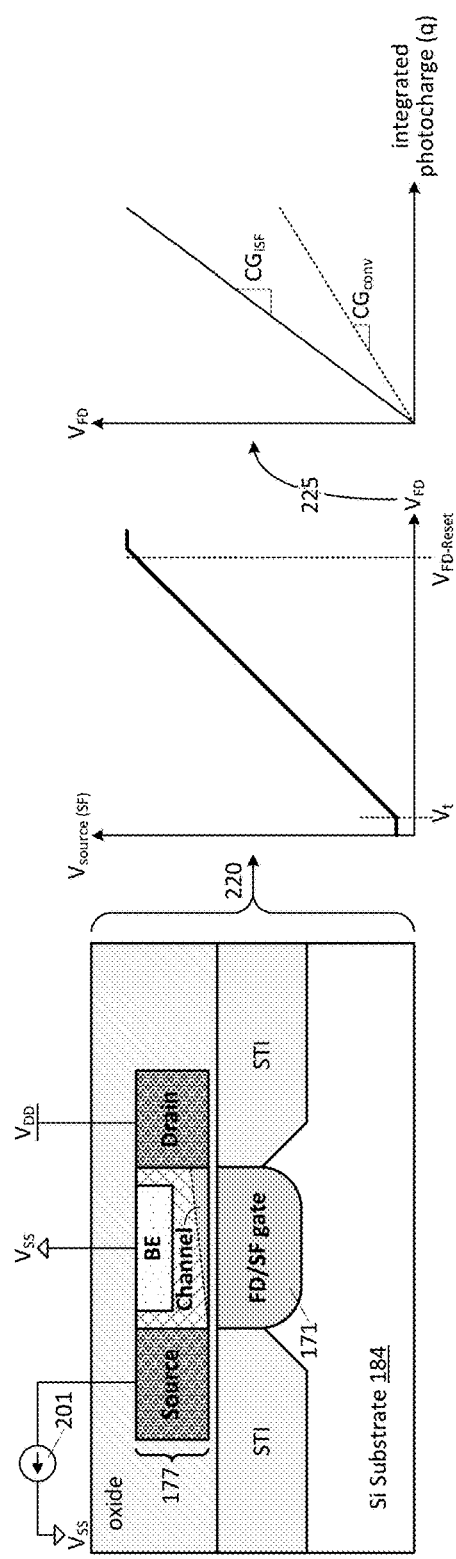
FIG. 2 illustrates a source-follower biasing arrangement that may be applied to the inverted source-follower transistor shown in FIG. 1.

FIG. 2 illustrates a source-follower biasing arrangement that may be applied to the inverted source-follower transistor shown in FIG. 1. In the depicted example, the bulk emulation region (BE) and transistor drain—both implemented within oxide-suspended silicon region 177—are coupled to respective supply rails $V_{SS}$ (e.g., ground) and $V_{DD}$ (or a dedicated pixel supply voltage, $V_{Pix}$). The transistor source terminal (also within oxide-suspended silicon region 177, adjacent the channel and opposite the drain) is coupled to a constant current source 201 that, by virtue of the constant current flowing from drain to source (through the field-effected channel), establishes a nominally steady-state voltage between the iSF gate (the floating diffusion 171) and iSF source for all FD voltages between the FD reset potential (maximum) and the iSF threshold voltage Vt (minimum below which the channel inverts to a non-conducting state). The bulk-emulator connection to $V_{SS}$ mitigates any floating back-gate effect (limiting the body effect and possibly other noise sources) in a manner similar to $V_{SS}$ connection to the single-crystal silicon substrate. The resulting linear "source-follower" relationship between the FD potential (the gate potential of the iSF) and the iSF source node (i.e., driving $V_{out}$ via the read-select transistor shown in FIG. 1) is shown at 220—the source voltage following the gate voltage (and thus the FD potential) with an ideally unity gain, but generally a somewhat lower gain (e.g., ~0.8) in actuality due to various losses. The plot at 225 (still FIG. 2) contrasts the relatively high and relatively low conversion gains achieved within an iSF pixel (i.e., in which parasitic contribution to the FD capacitance is reduced by omission of metal-to-FD interconnects) and conventional 4T pixel—an enhanced conversion gain within the iSF implementation that yields a quantizable $V_{out}$ in response to exceedingly small quantities of transferred photocharge (e.g., down to a single electron freed by a single photon strike).

Figure 3:
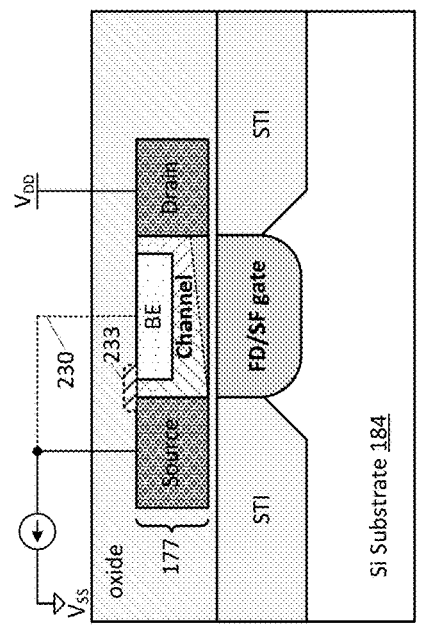
FIG. 3 illustrates alternative inverted-transistor biasing scheme similar to that of FIG. 2, but with the bulk emulation region coupled to the inverted-transistor source terminal instead of the $V_{SS}$ supply rail.

FIG. 3 illustrates alternative iSF biasing scheme similar to that of FIG. 2, but with the bulk emulation region coupled to the iSF source terminal instead of the $V_{SS}$ supply rail. As undesired back-gate effect in a conventional MOS field-effect transistor (MOSFET) generally results from a time-varying voltage between the bulk substrate and MOSFET source terminal, such effect may be eliminated altogether (or rendered negligible) within the iSF transistor by shorting (directly connecting) the bulk emulator and source terminal as shown—a direct connection made possible by the isolation of the BE within the oxide-suspended silicon region 177 (i.e., a biasing scheme not generally feasible with respect to bulk silicon region 184 as that region abuts the drains and sources of many millions of conventional MOS transistors). In a number of embodiments the bulk emulator is connected to the source terminal through a metal layer connection as shown conceptually at 230. In other embodiments, doped polysilicon or other conductive material may be deposited (or grown) atop or within the oxide-suspended silicon region (233) to connect the BE and transistor source, obviating metal interconnect 230.

Figure 4:
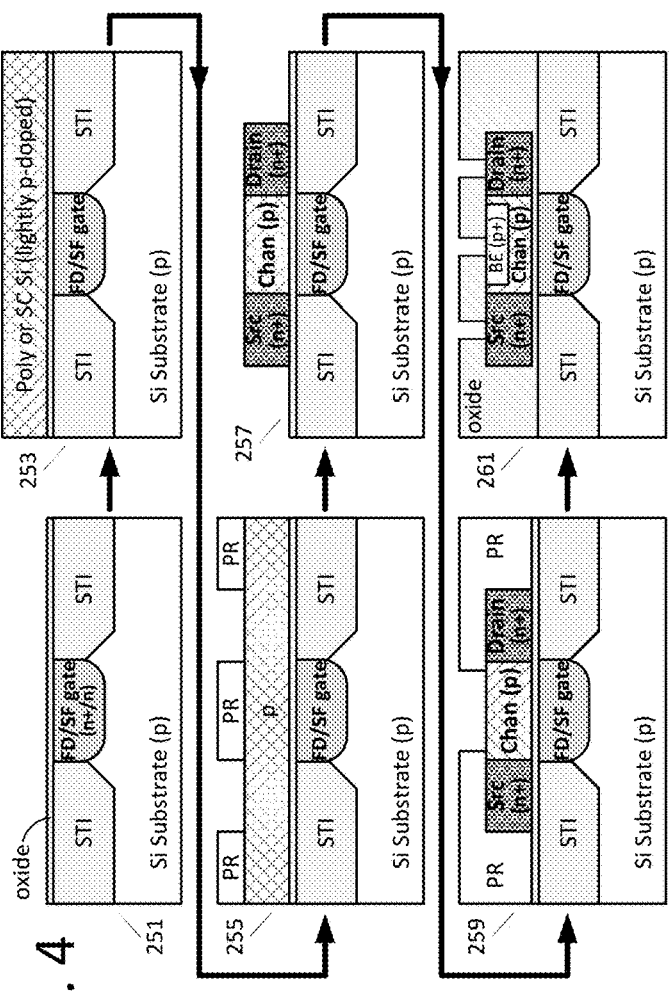
FIG. 4 illustrates an exemplary inverted-amplifier-transistor fabrication sequence.

FIG. 4 illustrates an exemplary inverted-amplifier-transistor fabrication sequence starting from the configuration shown at 251 (i.e., after the SF gate has been formed within the silicon bulk, isolated by STI structures and covered by a thin oxide layer). At 253, a lightly-p-doped polysilicon layer ("Poly") is deposited over the oxide layer to implement the oxide-suspended silicon in which the amplifier drain and source terminals (and bulk emulation region) will be formed. In alternative processes/embodiments, single-crystal silicon ("SC Si") may be grown over the oxide (epitaxial silicon) with a desired doping profile. In either case, the suspended silicon region is patterned with photoresist ("PR") as shown at 255 to make ready for n+ doping of the transistor source and drain terminals. After source/drain doping, the structure is further patterned with photoresist and then etched to yield per-transistor oxide-suspended silicon segments (FIG. 4 illustrates the oxide-suspended silicon segment for only one inverted transistor of the many millions present on the subject wafer and eventually singulated die) and thus the inverted transistor implementation shown at 257. Photoresist is deposited and patterned again as shown at 259 to make ready for bulk emulator formation (e.g., p-type dopant diffusion or implantation). After forming bulk emulator (e.g., via diffusion doping, ion implantation, etc.), the inverted transistor is completed by further photoresist patterning to enable oxide deposition (or growth) over the entirety of the suspended silicon region as shown at 261, with apertures maintained to enable subsequent silicide deposition and contact formation to the transistor source and drain terminals and bulk emulation region.

In alternative embodiments, the dopant and material polarities shown in FIG. 4 (and all inverted-amplifier pixels shown herein) may be reversed in a PMOS fabrication process. In that case, the transistor source and drain implemented in the oxide-suspended silicon (polysilicon or single-crystal silicon or other practicable semiconductor material) are p+ doped and the channel and bulk-emulation region are implemented with and/or doped to yield n-type silicon. The silicon bulk is likewise lightly n-doped with the floating diffusion node effected by p-type doping. In a pixel containing such inverted (PMOS) amplifier transistor, the remaining transistors (reset, and read-select), transfer gate and pinned photodiode may also be PMOS structures with corresponding reversal of the power rail polarity (i.e., the power rail coupled to the source terminals of the PMOS transistors and applied to bias the pinned photodiode). In yet other embodiments, n-type dopant may be implanted (e.g., via ion implantation) to form an n-type channel in the NMOS inverted-amplifier implementation (i.e., yielding a buried channel MOSFET) and p-type dopant may likewise be implanted to form an buried p-type channel in the PMOS inverted-amplifier implementation.

Figure 5:
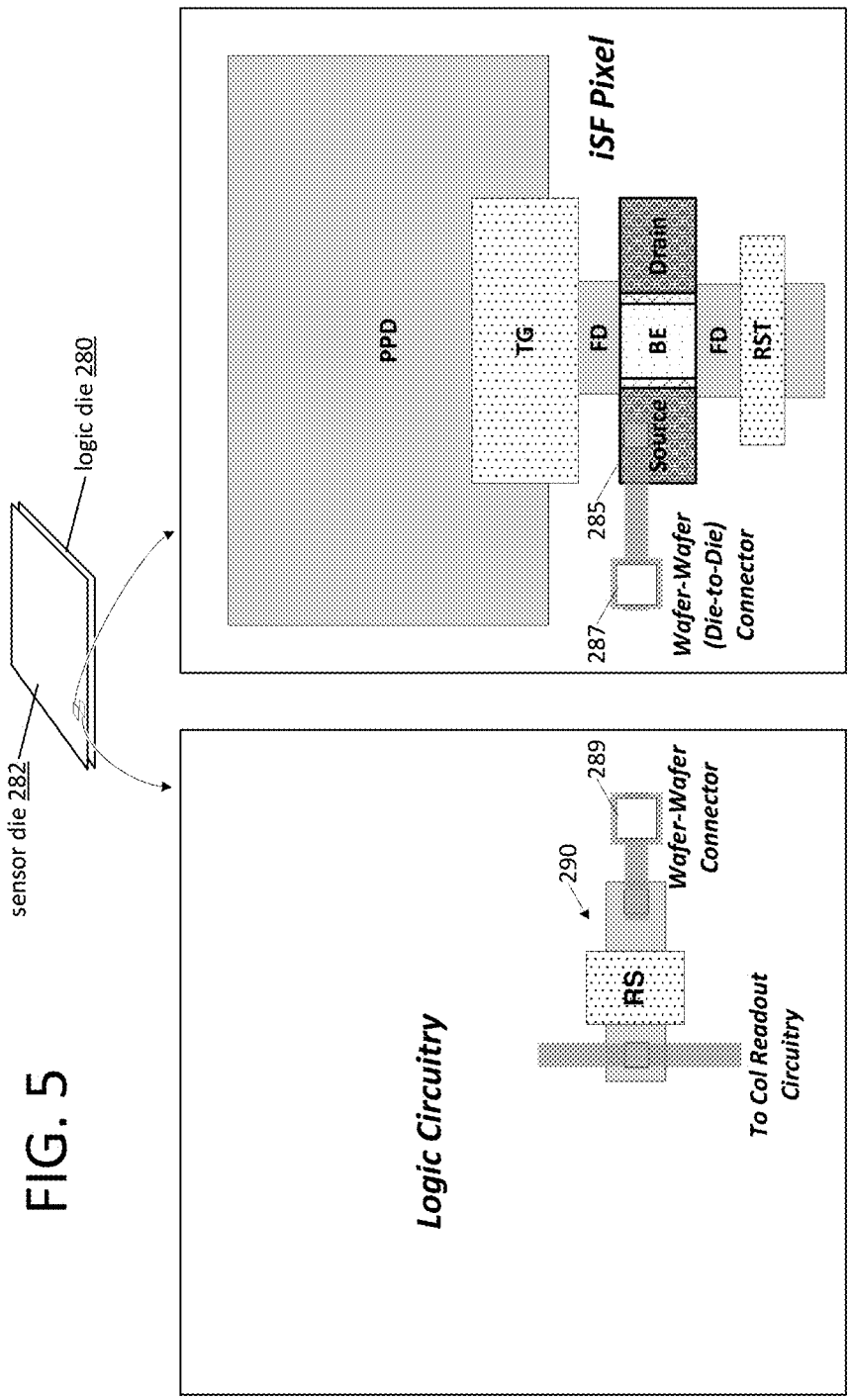
FIG. 5 illustrates a multi-die embodiment of inverted-amplifier-transistor pixel.

FIG. 5 illustrates an alternative iSF pixel embodiment in which the read-select transistor (RS) is relegated, along with all or any portion of the FIG. 1 column-readout and/or row control circuitry, to a logic die 280, the logic die being distinct from a sensor die 282 containing the remaining iSF components. Thus, the source terminal 285 of the iSF is coupled to a die-to-die connector 287 (a wafer-to-wafer connection during wafer-scale fabrication and prior to stacked-die singulation) on the sensor die that will be mated to a counterpart connection structure 285 on the logic die and thereby conductively couple the iSF source terminal to the drain of an off-die read-select transistor 290. In alternative embodiments the iSF pixel components (PPD, TD, FD, iSF and reset transistor) resident on the sensor die may be laid out in alternative configurations that leverage the area saved by removal/relocation of the read-select transistor, including configurations that yield a smaller pixel footprint and/or enlarged photodetector area. As with all embodiments herein, the bulk silicon on the backside of the sensor die may be thinned to enable backside illumination of the photodetector/PPD.

The various pixel and imaging-circuit architectures, circuits and layouts disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit, layout, and architectural expressions may be implemented include, but are not limited to, formats supporting behavioral languages such as C, Verilog, and VHDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, computer storage media in various forms (e.g., optical, magnetic or semiconductor storage media, whether independently distributed in that manner, or stored "in situ" in an operating system).

When received within a computer system via one or more computer-readable media, such data and/or instruction-based expressions of the above described circuits and device architectures can be processed by a processing entity (e.g., one or more processors) within the computer system in conjunction with execution of one or more other computer programs including, without limitation, net-list generation programs, place and route programs and the like, to generate a representation or image of a physical manifestation of such circuits and architectures. Such representation or image can thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the disclosed embodiments. In some instances, the terminology and symbols may imply details not required to practice those embodiments. For example, any of the specific circuit arrangements, pixel layouts, transistor types, signal polarities, described/depicted dimensions or thicknesses, material types, dopant types or polarities, etc. can be different from those described above in alternative embodiments. The term "coupled" is used herein to express a direct connection as well as a connection through one or more intervening functional components or structures. Programming of operational parameters may be achieved, for example and without limitation, by loading a control value into a register or other storage circuit within the above-described imaging IC in response to a host instruction (and thus controlling an operational aspect of the device and/or establishing a device configuration) or through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The terms "exemplary" and "embodiment" are used to express an example, not a preference or requirement. Also, the terms "may" and "can" are used interchangeably to denote optional (permissible) subject matter. The absence of either term should not be construed as meaning that a given feature or technique is required.

Various modifications and changes can be made to the embodiments presented herein without departing from the broader spirit and scope of the disclosure. For example, features or aspects of any of the embodiments can be applied in combination with any other of the embodiments or in place of counterpart features or aspects thereof. Accordingly, the specification and drawings are to be regarded in an illustrative rather than a restrictive sense.

What is claimed is:

1. An integrated-circuit pixel comprising:
    a silicon substrate having a photodetection element and a floating diffusion node formed therein;
    an oxide region; and
    a semiconductor region disposed on the oxide region opposite the silicon substrate and having (i) conductively doped regions at either end to form source and drain terminals of a field-effect transistor and (ii) a channel region between the source and drain terminals and situated opposite the oxide layer from the floating diffusion node such that the floating diffusion node implements a gate of the field-effect transistor,
    wherein the semiconductor region has a first carrier concentration and wherein a bulk-emulation sub-region of the semiconductor region has a second carrier concentration higher than the first p-type carrier concentration.

2. The integrated-circuit pixel of claim 1 wherein the semiconductor region comprises p-doped polycrystalline silicon.

3. The integrated-circuit pixel of claim 1 wherein the semiconductor region comprises p-doped single-crystal silicon.

4. The integrated-circuit pixel of claim 1 wherein the first and second carrier concentrations are p-type carrier concentrations.

5. The integrated-circuit pixel of claim 1 wherein the bulk-emulation sub-region is coupled to ground.

6. The integrated-circuit pixel of claim 1 wherein the bulk-emulation sub-region is coupled to the source terminal of the field effect transistor.

7. The integrated-circuit pixel of claim 6 wherein the bulk-emulation sub-region is coupled to the source terminal of the field effect transistor via at least one of doped polysilicon or silicide.

8. The integrated-circuit pixel of claim 1 wherein the drain terminal of the field effect transistor is coupled to a positive voltage supply and the source terminal of the field effect transistor is coupled via a nominally constant current source to a negative voltage supply such that the field effect transistor is biased in source-follower configuration.

9. The integrated-circuit pixel further comprising a transfer gate coupled between the photodetection element and the floating diffusion node to enable photocharge accumulated within the photodetection element to be transferred to the floating diffusion node and, by virtue of that photocharge transfer, render a voltage shift at the floating diffusion node, and wherein the field effect transistor is coupled in an amplifier configuration such that voltage shift at the floating diffusion node produces a corresponding voltage shift at the source terminal or the drain terminal of the field-effect transistor.

10. The integrated-circuit pixel of claim 1 wherein the field-effect transistor implements an amplifier transistor, and wherein the integrated-circuit pixel further comprises:
    a read-select transistor having source and drain terminals implemented by respective doped regions within the silicon substrate; and
    a metal layer interconnect between the source terminal of amplifier transistor and the drain terminal of the read-select transistor.

11. The integrated-circuit pixel of claim 1 further comprising a reset transistor having a drain terminal implemented by a doped region within the silicon substrate and a source terminal implemented by the floating diffusion node.

12. The integrated-circuit pixel of claim 1 wherein the photodetection element comprises a pinned photodiode, the silicon substrate comprises a single-crystal silicon substrate, and the floating diffusion node comprises an n-doped region within the single-crystal silicon substrate.

13. The integrated-circuit pixel of claim 12 further comprising a transfer gate disposed on the oxide region opposite a portion of the silicon substrate that separates the photodetection element from the floating diffusion node.

14. The integrated-circuit pixel of claim 1 further comprising a conductive contact implemented together with the silicon substrate, the oxide region and the semiconductor region in a first integrated-circuit die and coupled to the source terminal of the field-effect transistor, the conductive contact to be mated to a counterpart conductive contact on second integrated-circuit die having a read-select transistor that, when switched to a conducting state, couples the source terminal a pixel output line on the second integrated-circuit die.

15. An integrated-circuit image sensor comprising:
an array of pixels implemented in which each pixel includes:
a photodetection element and a floating diffusion node formed within a shared silicon substrate; and
a semiconductor region separated from the silicon substrate by an oxide region and having (i) conductively doped regions at either end to form source and drain terminals of a field-effect transistor and (ii) a channel region between the source and drain terminals and situated opposite the oxide layer from the floating diffusion node such that the floating diffusion node implements a gate of the field-effect transistor;
row control circuitry to output control signals to the array of pixels to enable shuttering, charge-integration and readout operations therein; and
a positive voltage supply rail, a negative voltage supply rail and a nominally constant current source, wherein the drain terminal of the field effect transistor is coupled to the positive voltage supply rail and the source terminal of the field effect transistor is coupled via the nominally constant current source to the negative voltage supply rail such that the field effect transistor is biased in source-follower configuration.

16. The integrated-circuit image sensor of claim 15 wherein each pixel further includes a transfer gate coupled between the photodetection element and the floating diffusion node to enable photocharge accumulated within the photodetection element to be transferred to the floating diffusion node and, by virtue of that photocharge transfer, render a voltage shift at the floating diffusion node, and wherein the field effect transistor is coupled in an amplifier configuration such that voltage shift at the floating diffusion node produces a corresponding voltage shift at the source terminal or the drain terminal of the field-effect transistor.

17. The integrated-circuit image sensor of claim 15 wherein the field-effect transistor implements an amplifier transistor, and wherein each pixel within the pixel array further includes:
a read-select transistor having source and drain terminals implemented by respective doped regions within the silicon substrate; and
a metal layer interconnect between the source terminal of amplifier transistor and the drain terminal of the read-select transistor.

18. The integrated-circuit image sensor of claim 15 further comprising column-readout circuitry coupled to the array of pixels to digitize, with respect to each pixel within the array of pixels, an analog signal output via the field effect transistor and corresponding to accumulated photocharge transferred from the photodetection element to the floating diffusion node.

19. An integrated-circuit image sensor comprising:
an array of pixels implemented in which each pixel includes:
a photodetection element and a floating diffusion node formed within a shared silicon substrate; and
a semiconductor region separated from the silicon substrate by an oxide region and having (i) conductively doped regions at either end to form source and drain terminals of a field-effect transistor and (ii) a channel region between the source and drain terminals and situated opposite the oxide layer from the floating diffusion node such that the floating diffusion node implements a gate of the field-effect transistor, wherein the semiconductor region has a first carrier concentration and wherein a bulk-emulation sub-region of the semiconductor region has a second carrier concentration higher than the first p-type carrier concentration; and
means for outputting control signals to the array of pixels to enable shuttering, charge-integration and readout operations therein.

* * * * *